US007081591B2

(12) United States Patent
Swetland

(10) Patent No.: US 7,081,591 B2
(45) **Date of Patent: *Jul. 25, 2006**

(54) CIRCUIT BOARD

(76) Inventor: Paul A. Swetland, 728 Washington St., Woodstock, IL (US) 60098

(*) Notice: Subject to any disclaimer, the term of this patent is extended or adjusted under 35 U.S.C. 154(b) by 327 days.

This patent is subject to a terminal disclaimer.

(21) Appl. No.: 10/715,750

(22) Filed: Nov. 18, 2003

(65) Prior Publication Data

US 2004/0099439 A1 May 27, 2004

Related U.S. Application Data

(63) Continuation-in-part of application No. 10/663,540, filed on Sep. 16, 2003, and a continuation of application No. 10/163,138, filed on Jun. 5, 2002, now Pat. No. 6,650,548.

(51) Int. Cl.
*H05K 1/00* (2006.01)

(52) U.S. Cl. .................................................... 174/254

(58) Field of Classification Search ................ 174/254; 361/780, 805, 807

See application file for complete search history.

(56) References Cited

U.S. PATENT DOCUMENTS

| | | | | |
|---|---|---|---|---|
| 3,085,177 | A | 4/1963 | Thompson | 317/101 |
| 3,205,469 | A | 9/1965 | Frank et al. | 339/18 |
| 3,778,745 | A | 12/1973 | Fischer | 339/18 |
| D235,554 | S | 6/1975 | Portugal | D26/1 B |
| 3,898,535 | A | 8/1975 | Ebbert | 317/100 |
| 4,039,236 | A | 8/1977 | Schepler | 339/17 |
| 4,129,349 | A | 12/1978 | von Roesgen | 339/17 |
| 4,522,449 | A * | 6/1985 | Hayward | 361/775 |
| 4,606,725 | A | 8/1986 | Chio | 434/224 |
| 4,772,864 | A | 9/1988 | Otto et al. | 333/238 |
| 4,791,722 | A | 12/1988 | Miller, Jr. | 29/850 |
| 4,907,127 | A | 3/1990 | Lee | 361/397 |
| 5,014,163 | A | 5/1991 | Lin | 361/415 |
| 5,309,327 | A | 5/1994 | Slater | 361/805 |
| 5,339,219 | A | 8/1994 | Urich | 361/760 |
| 6,650,548 | B1 * | 11/2003 | Swetland | 361/780 |
| 2002/0012236 | A1 | 1/2002 | Dimarco | 361/796 |
| 2002/0126462 | A1 * | 9/2002 | Roussel et al. | 361/760 |

* cited by examiner

*Primary Examiner*—Kamand Cuneo
*Assistant Examiner*—Yuriy Semenenko
(74) *Attorney, Agent, or Firm*—Thomas R. Vigil; Welsh & Katz, Ltd.

(57) ABSTRACT

The printed circuit board comprises a plate made of an insulating material and having opposite surfaces and having a connection strip portion including a grouping of at least three rows of sets of at least three spaced apart connection locations in each set on at least one of said plate surfaces, the centers of the connection locations in each set being spaced from each other by a predetermined distance, groups of conductive strips on one of the plate surfaces, each conductive strips being aligned with and in electrical conductivity with one of the rows of three spaced apart connection locations each connection location defining an electrical contact point on the strip with all of the conductive strips being electrically isolated from each other, and the sets being aligned in each row end-to-end and each row being offset or staggered from each adjacent row, such that an array of spaces is formed, with each space in an interior row forming a center of a diamond shaped four connection point connector, that has a connection location on a conductive strip at each of its four points or corners, that originates from a different conductive strip.

23 Claims, 14 Drawing Sheets

Fig. 25 Prior Art
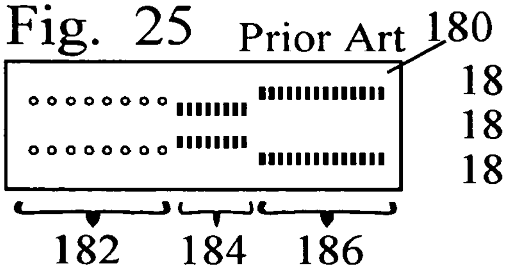
Fig. 26
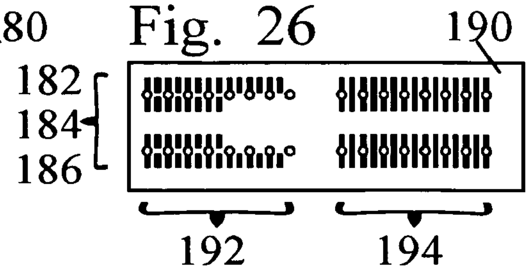
Fig. 27
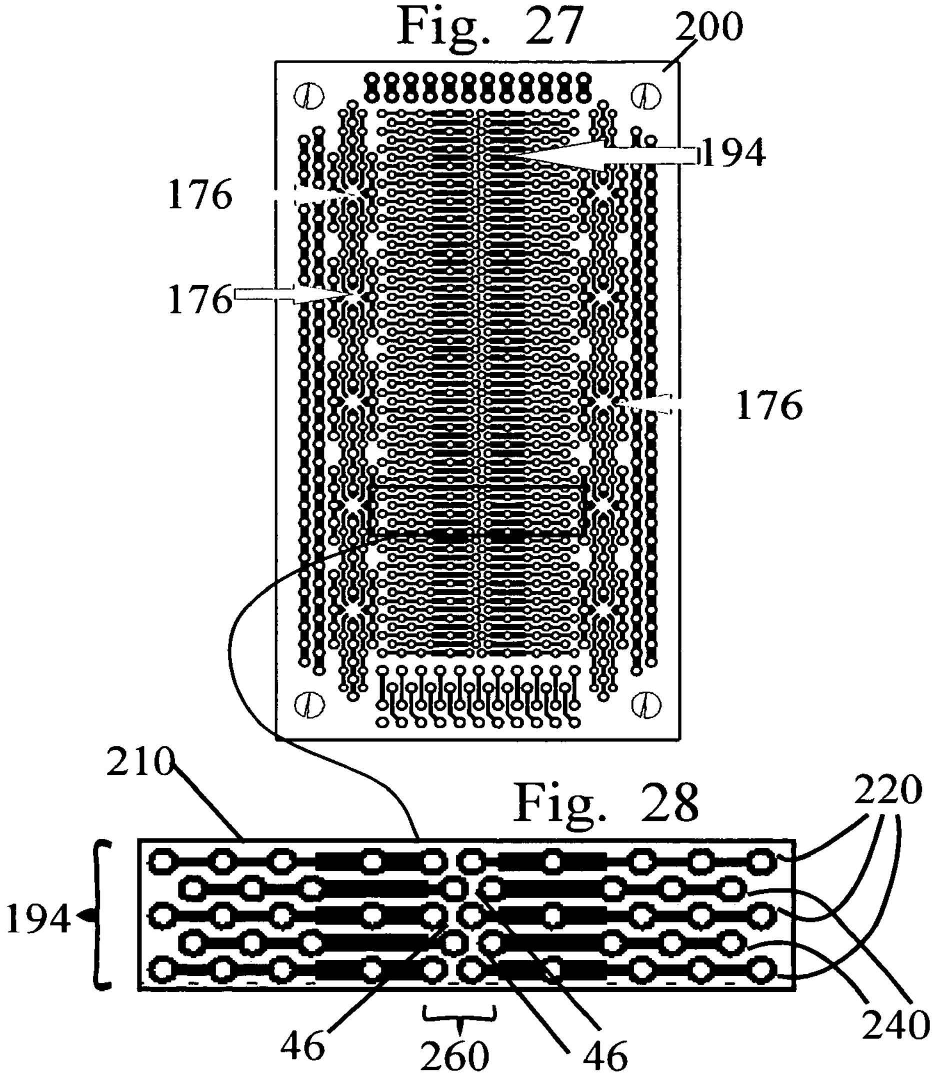
Fig. 28

CIRCUIT BOARD

BACKGROUND OF THE INVENTION

1. Field of the Invention

The present invention relates to an electrical socket device and a circuit board device. More specifically, the present invention relates to a product commonly known as a solder-less breadboard and a product commonly known as a prototype circuit board, or simply a circuit board and particularly to a new connection structure that, when used in conjunction with either or both of these prior boards, creates an entirely new method of interfacing electronic circuits that appears to be far superior to any other method available to date.

2. Description of the Related Art

All solder-less breadboards and bread-boarding systems available to date are substantially similar to the breadboard design disclosed in U.S. Pat. Des. 235,554. This solder-less breadboard is a reusable platform on which temporary electronic circuits can be built, tested, modified and evaluated without having to solder the various electronic components and wires in place. It comprises an insulated electrical socket, or sockets that contain spring clip electrical connectors with a plurality (usually five) contacts spaced on 0.1 inch centers that individual pins or leads of electronic components and wires plug into. There are two basic parts. The first is a distribution strip, which contains one or two rows of connectors running in the same direction as the row that are all electrically connected together, such that it distributes an electrical signal or power to every contact in the row from end to end, with each row electrically isolated from each other, thus distributing two separate voltages or signals. The second is a terminal strip, which typically contains two rows of connectors each having five contacts on 0.1 inch centers running perpendicular to the direction of the row. All the connectors are parallel to each other and electrically isolated from each other. The two rows are electrically isolated from each other and the nearest contacts in each row are spaced on 0.3 inch centers, such that integrated circuits in DIP packages can be plugged into the center of the terminal strip, with each pin plugging into a separate connector. This leaves four available contacts running perpendicular to the integrated circuit and parallel to each other to carry signals to or from the pins. A terminal strip is placed between two distribution strips, such that power or signals run parallel to each other on opposite sides of the terminal strip and perpendicular to the signals on the terminal strip, such that power can be applied to any desired connector on the terminal strip by a short piece of wire from the closest contact on the distribution strip. Wire jumpers can be used to connect signals from any pin on any integrated circuit to any other pin. All other components required by the circuit such as transistors, SCRs, TRIACs, LEDs, etc. must also be plugged into other unused connectors on the terminal strip and then signals run to or from their pins which are interconnected by resistors, capacitors or wires. While there have been many embodiments of this design over the years, including various lengths of the individual pieces, and various mixing and matching of the various pieces of various lengths to create various shapes, sizes and larger capacity systems, there have been no real changes to the functionality of the design. That is to say that the method of placing components and making the required electrical connections between the components in order to build a circuit has not changed. While all of the various embodiments of the design are in themselves extremely useful tools they also all present the user with certain challenges and frustrations that are inherent in the design.

The solder-less breadboard is designed to accommodate integrated circuits in dual inline packages as well as resisters, capacitors, inductors, diodes, transistors and other various components in 3, 4 and more pin packages. The first problem arises out of the fact that 3 and 4 pin devices must be placed in the terminal strip area. This takes up valuable room which lessens the number of integrated circuits that can be placed on the board.

The second problem arises when the various signals on various pins of the integrated circuits need to be interconnected through resistor voltage dividers or resistor/capacitor networks, both of which are common and normal when working with operational amplifiers, timers and mono-stable devices. Again the interconnections of these associated components must be made in the terminal strip area taking away even more room for integrated circuits.

The third problem arises out of the fact that the signal pins on the integrated circuits are practically never in an order that is compatible with pin order of the 3 pin devices. This results in a jumble of crisscrossing interconnecting wires that make the circuit hard to follow and increases the probability of incorrect connections being made in the circuit. This also makes it much more difficult to troubleshoot the circuit and make modifications to the circuit as needed.

The historical solution to these problems has been to use a bigger breadboard. While this solution is very desirable to the breadboard manufactures, it is not cost effective to the user, from which arises the fourth problem: it results in building an extremely large circuit that for obvious reasons is more difficult to transfer to a smaller more usable prototype circuit board for rigorous testing or to a suitable circuit board for the final intended use of the circuit.

The fifth problem arises out of the fact that there is no standardized set of size for size, connection for connection compatible prototype circuit boards available that would allow the user to quickly, easily and accurately transfer the circuit to a circuit board for rigorous testing or final building.

The sixth problem arises from the fact that existing solder-less breadboards and prototype circuit boards are not available in sizes that are compatible with existing standard sized enclosures that are readily available and economically affordable.

The seventh problem arises from the fact that in an engineering environment every new circuit requires a draftsperson to formalize a new schematic, then the new schematic is sent to CAD/CAM to create artwork for a new circuit board design. Then the artwork is used to make a new circuit board, which then has to be drilled and sent back to engineering in order to build a prototype for testing. Any result of testing that requires a change in the circuit also requires this entire process to be repeated. This can be a long process, requiring weeks, months, or even years, to complete a final working prototype.

All of these problems are time consuming and frustrating to the user. When companies are fighting the clock to get their products on the market, time can be more than money, it can be the difference between failure and survival.

Examples of analogous and non-analogous previously proposed breadboards are disclosed in the following analogous and non-analogous U.S. Patents.

| Patent No. | Patentee |
|---|---|
| 3,085,177 | Thompson |
| 3,205,469 | Frank et al. |
| 3,778,745 | Fischer |
| 3,898,535 | Ebbert |
| 4,039,236 | Schepler |
| 4,129,349 | von Roesgen |
| 4,522,449 | Hayward |
| 4,606,725 | Chio |
| 4,772,864 | Otto et al. |
| 4,791,722 | Miller, Jr. |
| 4,907,127 | Lee |
| 5,014,163 | Lin |
| 5,309,327 | Slater |
| 5,339,219 | Urich |
| Des. 235,554 | Portugal |
| Published Patent Application | |
| 2002/0012236 | DiMarco |

BRIEF SUMMARY OF THE INVENTION

The breadboard design of the present invention solves the problems described above. Accordingly, it is a first aspect of the present invention to provide a new method of interfacing electronic circuits by use of a new system of solder-less breadboard devices and new prototype circuit board devices that contain a new apparatus, while at the same time making the physical dimensions of the devices, with respect to both size and mounting hole, compatible with readily available standard size enclosures and also to provide a new system of add on devices that will allow existing breadboards and breadboard systems to be upgraded in order to allow them to support a new method for interfacing electronic circuits. In order to achieve this first aspect of the present invention, a new electrical socket device is made of an insulated material, having on its top surface at least twelve linear groupings of at least three holes in each group on predetermined, e.g., 0.1 inch, centers, that are aligned on a bottom surface with at least three rows having at least four channels, each channel containing an electrical connector or elongate electrical conductor having at least three contacts on predetermined, e.g., 0.1 inch, centers that are electrically connected together, with all the connectors being electrically isolated from each other, and all the connectors in each row being separated from each other by one space, and each row being offset from each adjacent row by at least one space, such that an array of spaces is formed, with each space in an interior row being the center of a diamond shaped four pin socket, that has a contact at each of its four points, that originate from a different connector, whether the new socket device is molded in a separate piece, or the new socket device is combined with components of at least one other socket similar to either of the sockets found in a conventional breadboard as shown in U.S. Pat. Des. 235,554, such that the new socket device can be used with other sockets similar to those sockets in conventional breadboards for the purpose of creating a new solder-less breadboard design for interfacing electronic circuits, or such that the new socket device is combined with both sockets similar to the sockets in conventional breadboards molded in one piece, thereby creating a new solder-less breadboard device for interfacing electronic circuits.

Further, according to another aspect of the present invention. A new printed circuit board device (as shown in FIG. 12) is made of an insulated material, having on its top surface at least twelve linear groupings of at least three holes in each group on 0.1 inch centers, that are aligned on the bottom surface with at least three rows having at least four copper foil traces, each trace having at least three pads with drilled holes on 0.1 inch centers, with all the traces being electrically isolated from each other, and all the traces in each row being separated from each other by one space, and each row being offset from each adjacent row by at least one space, such that an array of spaces is formed, with each space in an interior row being the center of a diamond shaped four pin socket, that has a pad with a drilled hole at each of its four points, that originate from a different trace, whether the new printed circuit board device is a separate piece, or the new printed circuit board device is combined with a foil trace pattern that is equivalent to a socket similar to either of the sockets disclosed in U.S. Pat. No. D235,554 on one circuit board, or whether the new printed circuit board device is combined with foil trace patterns that are equivalent to both sockets similar to the sockets disclosed in U.S. Pat. No. D235,554 on one circuit board which creates a new printed circuit board device for interfacing electronic circuits.

Further, according to a third aspect of the present invention, a new electrical socket device according to the first aspect of the present invention (as shown FIG. 4), is molded in a separate piece such that the new socket device can be used with other sockets similar to those sockets disclosed in U.S. Pat. No. D235,554 for the purpose of creating a new solder-less breadboard device (as shown in FIG. 7) for interfacing electronic circuits.

Further, according to a fourth aspect of the present invention, a new electrical socket device according to the first aspect of the present invention (as shown in FIG. 6) combined with components of at least one other socket similar to either of the sockets disclosed in U.S. Pat. No. D235,554, is molded in one piece such that the new socket device can be used with other sockets similar to those sockets disclosed in U.S. Pat. No. D235,554 for the purpose of creating a new solder-less breadboard device (as shown in FIG. 9), for interfacing electronic circuits.

Further, according to a fifth aspect of the present invention, a new electrical socket device according to the first aspect of the present invention, combined with both sockets similar to the sockets disclosed in U.S. Pat. No. D235,554 is molded in one piece (as shown in FIG. 11), which creates a new solder-less breadboard device for interfacing electronic circuits.

Further, according to a sixth aspect of the present invention, a new printed circuit board device according to the second aspect of the present invention, that is combined with foil trace patterns that are equivalent to both sockets similar to the sockets disclosed in U.S. Pat. No. D235,554 is made on one circuit board which creates a new printed circuit board device (as shown in FIG. 12) for interfacing electronic circuits.

Further, according to a seventh aspect of the present invention, a new system for interfacing electronic circuits that is created by making a new solder-less breadboard device according to the fifth aspect of the present invention (as shown in FIG. 11) and a new printed circuit board device according to the sixth aspect of the present invention (as shown in FIG. 12), that are size for size and connection for connection, identical to each other, such that any electronic circuit that is built on the new solder-less breadboard device can be reproduced exactly on the new printed circuit board device, thus creating a finished working prototype without having to design and build a unique printed circuit board for the electronic circuit.

Further, according to an eighth aspect of the present invention, a new system for interfacing electronic circuits that is created by making a plurality of new solder-less breadboard device according to the seventh aspect of the present invention (as shown in FIGS. 14, 16, 18 and 20) and a plurality of new printed circuit board device according to the seventh aspect of the present invention (as shown in FIGS. 15, 17, 19 and 21) in each pair (as shown in FIGS. 14 & 15, 16 & 17, 18 & 19, 20 & 21) such that each the pair of devices fit directly into standard sized enclosures, with both devices in each pair having mounting holes that align with the mounting standoffs that exist in the standard sized enclosures, thus allowing mounting without need of modification to either the device or the enclosure.

Further, according to a ninth aspect of the present invention, a new method of interfacing electronic circuits (as shown in FIG. 13) is created by using a new electrical socket device according to the first aspect of the present invention (as shown in FIG. 11) for interconnecting resisters, capacitors, diodes, etc. and connecting transistors, FETs, SCRs, TRIACs, etc. on a solder-less breadboard in an area outside of the terminal strip, such that all interface functions like input signal conditioning, timing, clocking, inter-circuit level changing and output drivers can exist on the same breadboard without sacrificing integrated circuit capacity in the terminal strip, thus making bread-boarding quicker, easier and neater while building circuits that are cleaner, easier to follow and more compact.

Further, according to a tenth aspect of the present invention, a new method of interfacing electronic circuits (as shown in FIG. 13) is created by using a new printed circuit board device according to the second aspect of the present invention (as shown in FIG. 12) for interconnecting resisters, capacitors, diodes, etc. and connecting transistors, FETs, SCRs, TRIACs, etc. on a printed circuit prototyping board in an area outside of the terminal strip, such that all interface functions like input signal conditioning, timing, clocking, inter-circuit level changing and output drivers can exist on the same prototype board without sacrificing integrated circuit capacity in the terminal strip, thus making prototyping quicker, easier and neater while building circuits that are cleaner, easier to follow and more compact.

Further, according to an eleventh aspect of the present invention, a new circuit board (as shown in FIG. 24) is created by providing a printed circuit board comprising a plate made of an insulating material and having opposite surfaces and having a connection strip portion including a grouping of at least three rows of sets of at least three spaced apart connection locations in each set on at least one of said plate surfaces, the centers of the connection locations in each set being spaced from each other by a predetermined distance, groups of conductive strips on one of the plate surfaces, each conductive strips being aligned with and in electrical conductivity with one of the rows of three spaced apart connection locations each connection location defining an electrical contact point on the strip with all of the conductive strips being electrically isolated from each other, and the sets being aligned in each row end-to-end and each row being offset or staggered from each adjacent row, such that an array of spaces is formed, with each space in an interior row forming a center of a diamond shaped four connection point connector, that has a connection location on a conductive strip at each of its four points or corners, that originates from a different conductive strip.

Further, according to a twelfth aspect of the present invention, a new circuit board is created by providing printed circuit board comprising a plate made of an insulating material and having opposite surfaces and having a connection strip portion including a grouping of at least three rows of sets of at least three spaced apart connection locations in each set on at least one of the plate surfaces, the centers of the connection locations in each set being spaced from each other by a predetermined distance, groups of conductive strips on one of the plate surfaces, each conductive strips being aligned with and in electrical conductivity with one of the rows of three spaced apart connection locations each connection location defining an electrical contact point on the strip with all of the conductive strips being electrically isolated from each other, and the sets being aligned in each row end-to-end and each row being offset or staggered from each adjacent row, such that an array of spaces is formed, with each space in an interior row forming a center of a diamond shaped four connection point connector, that has a connection location on a conductive strip at each of its four points or corners, that originates from a different conductive strip, a terminal strip portion in the plate comprising at least one elongate grouping of transversely extending rows of connection locations, with each row containing three to seven connection locations, a conductive strip on one of the plate surfaces being aligned with and in electrical conductivity with each row, each connection location defining an electrical contact point on the conductive strip, with all of the conductive strips being electrically isolated from each other, and the adjacent connection locations having a predetermined center-to-center spacing between them and a distribution strip portion comprising at least one line of spaced apart connection locations on at least one surface of the plate, with adjacent connection locations being separated by a predetermined center-to-center spacing and a conductive strip on the plate surface, being aligned with and in electrical conductivity with one of the rows of spaced apart connection locations.

BRIEF DESCRIPTION OF THE SEVERAL VIEWS OF THE DRAWINGS

FIG. 25 is a plan view of a circuit board containing three prior art patterns for mounting integrated circuits.

FIG. 26 is a plan view of a circuit board containing a new universal pattern for mounting integrated circuits created by combining the patterns shown in FIG. 25.

FIG. 27 is a plan view of printed circuit board containing the patterns shown in the previous figures.

FIG. 28 is a plan view of a center section of the circuit board shown in FIG. 27.

DETAILED DESCRIPTION OF THE INVENTION

Figure 1:
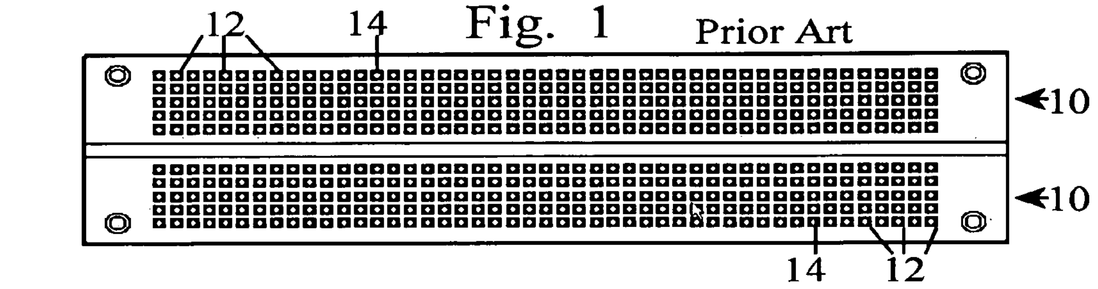
FIG. 1 is a top plan view of a prior art terminal strip.

In FIG. 1 there are illustrated two prior art terminal strips 10 each comprising a plurality of rows 12 of square pinholes 14 and with each row 12 containing five (5) square pinholes.

Figure 2:
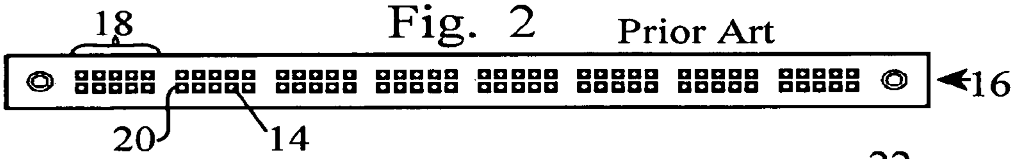
FIG. 2 is a top plan view of a prior art distribution strip.
Figure 3:
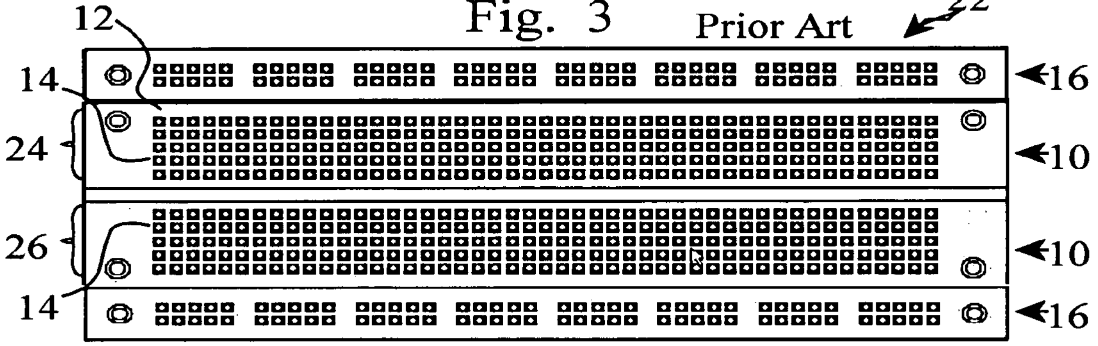
FIG. 3 is a top plan view of a prior art, standard, solder-less breadboard including the terminal strip of FIG. 1 and two distribution strips as shown in FIG. 2.

In FIG. 2 there is illustrated a prior art distribution strip 16 comprising eight (8) pairs 18 of rows 20 of square pinholes 14 and FIG. 3 is a combination of terminal strips 10 and distribution strips 16 arranged to form a prior art breadboard 22 similar to the breadboard shown in U.S. Design Pat. Des. 235,554.

Each small square pinhole 14 in the terminal strip 10 represents an electrical contact point 14 including an electrical clip which is hidden from view and which can be of the type shown in the Lin U.S. Pat. No. 5,014,163 or in the Portugal Des. 235,554. Each row 12 of five contact points 14 viewing same in the vertical direction are electrically connected to each other by a conductor strip therebeneath and hidden from view, and each one row 12, with five contact points 14 being electrically isolated from adjacent rows 12. Thus the terminal strip 10 can be viewed as two banks 24 and 26 of row connectors 12 that allow the interconnection of electrical components viewing the strip 10 in the vertical direction.

Here there s a 0.3 inch center-to-center spacing between the bottom contact point 14 of each row 12 in the top bank 24 and the top contact point 14 of each row 12 in the bottom bank 26 of the terminal strip 10. This spacing is consistent with that of a dual inline package integrated circuit. Thus integrated circuits can be plugged into the center portion of the strip such that each pin of the integrated circuit then has four available contact points 14 that can carry electrical signals to or from it.

All other electrical components in the circuit must also have their pins plugged into contact points 14 in the terminal strip 10 in order to be connected.

Again, each small square pinhole 14 in the distribution strip 16 represents an electrical contact point 14. All of the contact points 14 in each horizontal row 20 are electrically connected to each other, however the two rows are electrically isolated from each other. Thus the distribution strip 16 uses pairs 18 of rows 20 to distribute two separate electrical signals or power viewing the strip 16 in the horizontal direction from end to end.

A standard solder-less breadboard 22 is shown in FIG. 3 and is created by placing a pair of terminal strips 10 between two (2) distribution strips 16.

Figure 4:
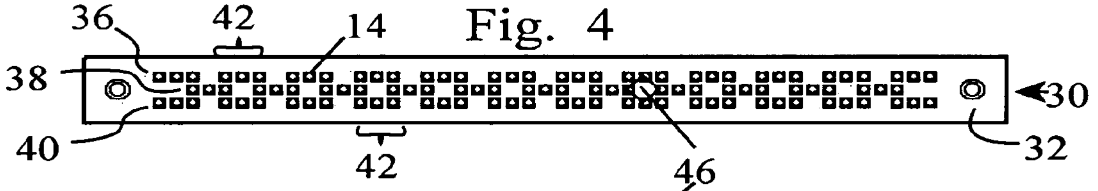
FIG. 4 is a top plan view of a connection strip that can be used in a breadboard constructed according to the teachings of the present invention.
Figure 5:
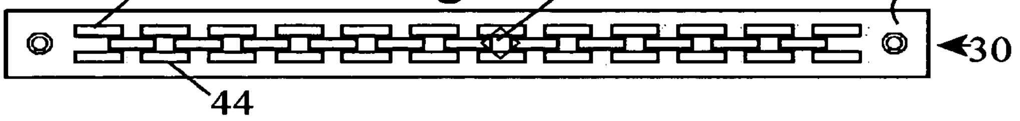
FIG. 5 is a plan view of the conductor strips on the bottom of a printed circuit board constructed from the breadboard shown in FIG. 4.
Figure 6:
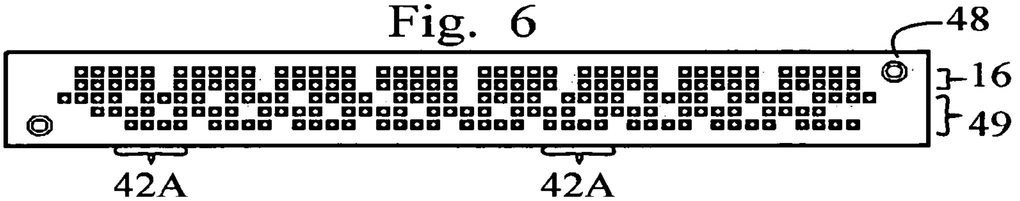
FIG. 6 is a top plan view of a solder-less breadboard comprising a distribution strip and a connection strip and is constructed according to the teachings of the present invention.

As shown in FIG. 4, a new connection strip 30, made of an insulated material, has on its top surface 32, at least three lines 36, 38 and 40 of twelve linear groupings or strips 42 with at least three pinholes or contact points 14 in each group 42 on 0.1 inch centers, that are aligned with at least three rows of conductor strips or channels 44 (FIG. 5) in a printed circuit board, each channel 44 having an electrical conducting strip 44 having at least three contact points 14 on 0.1 inch centers that are electrically connected together, with all the conductor strips 44 being electrically isolated from each other, and all the contact points 14 in each group 42 being separated from each other by one space, and each group 42 being offset or staggered from each adjacent group 42 by at least one space, such that an array of spaces is formed, with each space in an interior line being the center of a diamond shaped four pin socket 46 (FIG. 4), that has a contact point 14 at each of its four points, that originate from a different connector strip 42/conductor strip 44. This arrangement is an important teaching of the present invention. It is to be noted that the drawings herein show the conductor strips as printed circuit type strips whereas in the breadboards constructed according to the teachings of the present invention, the connector clips are in gangs of three or four or five or more clips integrally connected by a strip of metal, much like the "terminals" disclosed in the Lin U.S. Pat. No. 5,014,163, and are imbedded or mounted in the plate of the breadboad. FIG. 6 shows a distribution strip section 47 combined in one plate or board 48 with a connector strip section 49 having 4 pinhole 14 groupings 42A.

Figure 7:
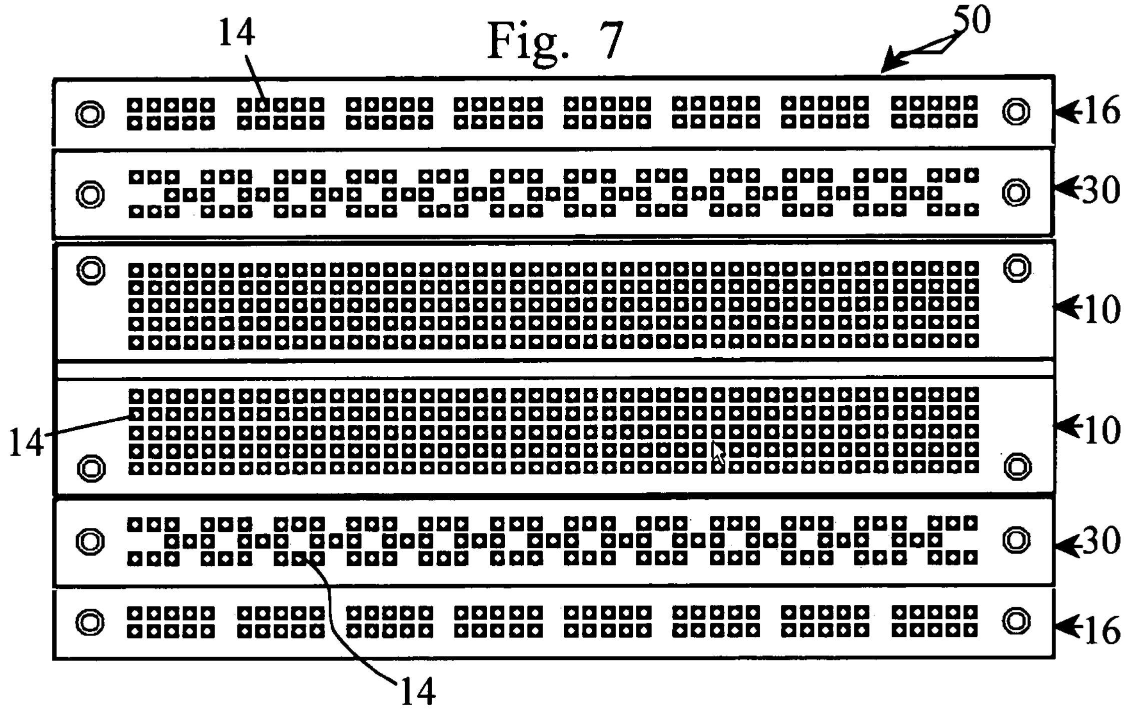
FIG. 7 is a top plan view of a solder-less breadboard comprising a further arrangement of distribution strips, terminal strips and connection strips and is constructed according to the teachings of the present invention.

FIG. 7 shows a new solder-less breadboard 50 constructed according to the teachings of the present invention. In this embodiment, a connection strip 30 is placed on the top and bottom between a center double terminal strip 10 and a upper or lower distribution strip 16.

Figure 8:
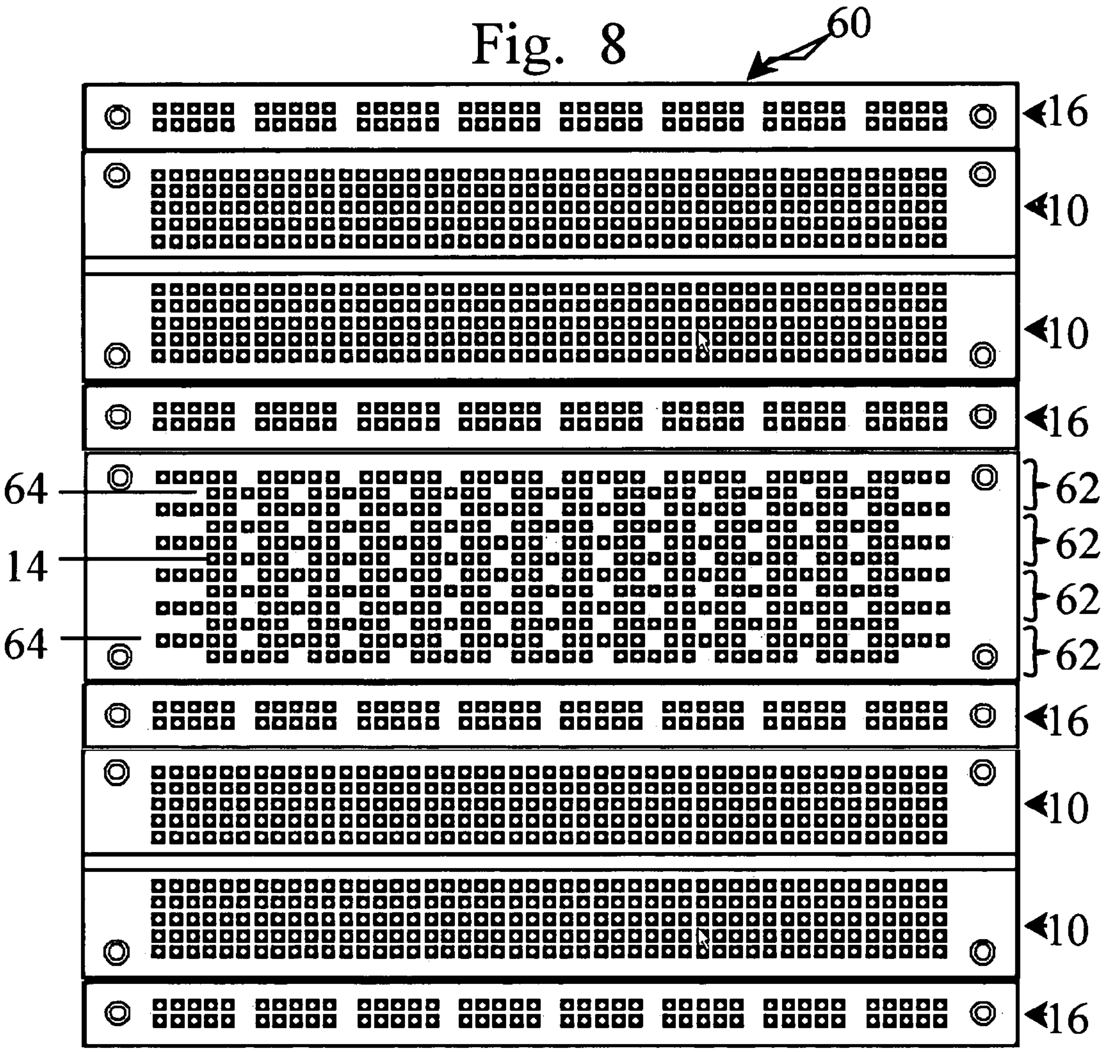
FIG. 8 is a top plan view of a solder-less breadboard comprising another arrangement of distribution strips, terminal strips and connection strips and is constructed according to the teachings of the present invention.

A large breadboard 60 is shown in FIG. 8. In this embodiment more strip sections 16,10, 10, 16, 47, 47, 47, 47 16, 10, 10 and 16 are employed.

More specifically, the breadboard 60 includes, from top to bottom, a distribution strip section 16, a double terminal strip section 10, a distribution strip section 16, four (4) modified connection strip sections 62 equivalent to connection strip sections 47, each including groups 64 of four (4) pinholes or contact points 14 instead of three (3) and where two, end-of-group pinholes 14 of one group 64 are adjacent two, end-of-group, pinholes 14 in an adjacent group 64, a distribution strip section 16, a terminal strip section 10 and a distribution strip section 16.

Figure 9:
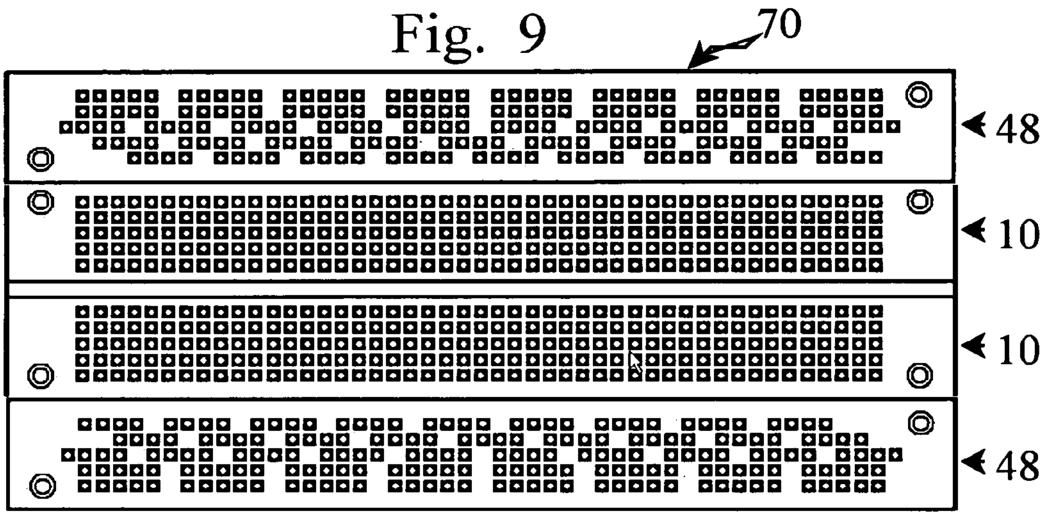
FIG. 9 is a top plan view of a solder-less breadboard comprising still another arrangement of distribution strips, terminal strips and connection strips and is constructed according to the teachings of the present invention.

In FIG. 9 is illustrated a breadboard 70 having a different arrangement of strip sections 10, 16 and 62.

More specifically, the breadboard 70 includes, from top to bottom, a combined distribution strip 16 and a modified connection strip 62, a terminal strip 10, a combined modified connection strip 62 and a distribution strip 16.

Figure 10:
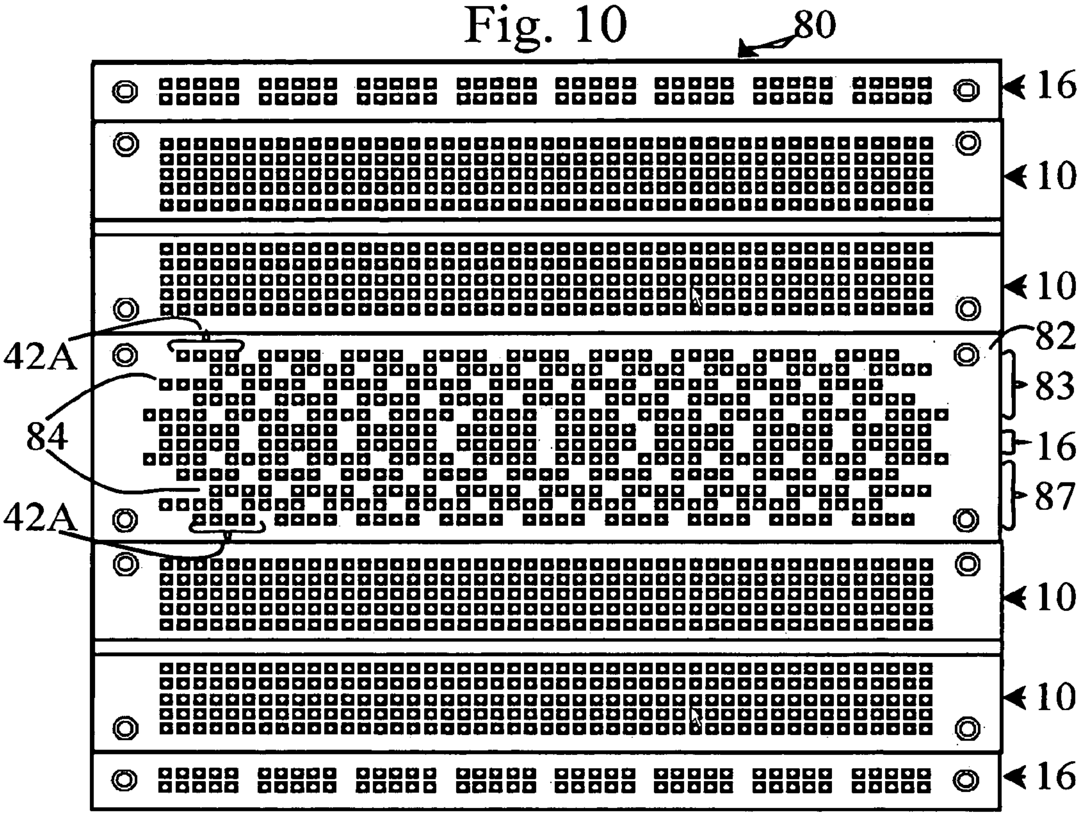
FIG. 10 is a top plan view of a solder-less breadboard comprising a still further arrangement of distribution strips, terminal strips and connection strips and is constructed according to the teachings of the present invention.

In FIG. 10 is illustrated a breadboard 80 which includes, from top to bottom, a distribution strip 16, a terminal strip 10, a connection strip 82 including a first grouping 83 of five linear groups 84 each including nine (9) groups 86 of pinholes or contact points 14 with four pinholes or contact points 14 per group 86 and where two, end-of-group pinholes 14 of one group 64 are adjacent two, end-of-group, pinholes 14 in an adjacent group 84, a distribution strip section 16 and a second group 87 of five linear groups 84, a double terminal strip 10 and a distribution strip 16.

Figure 11:
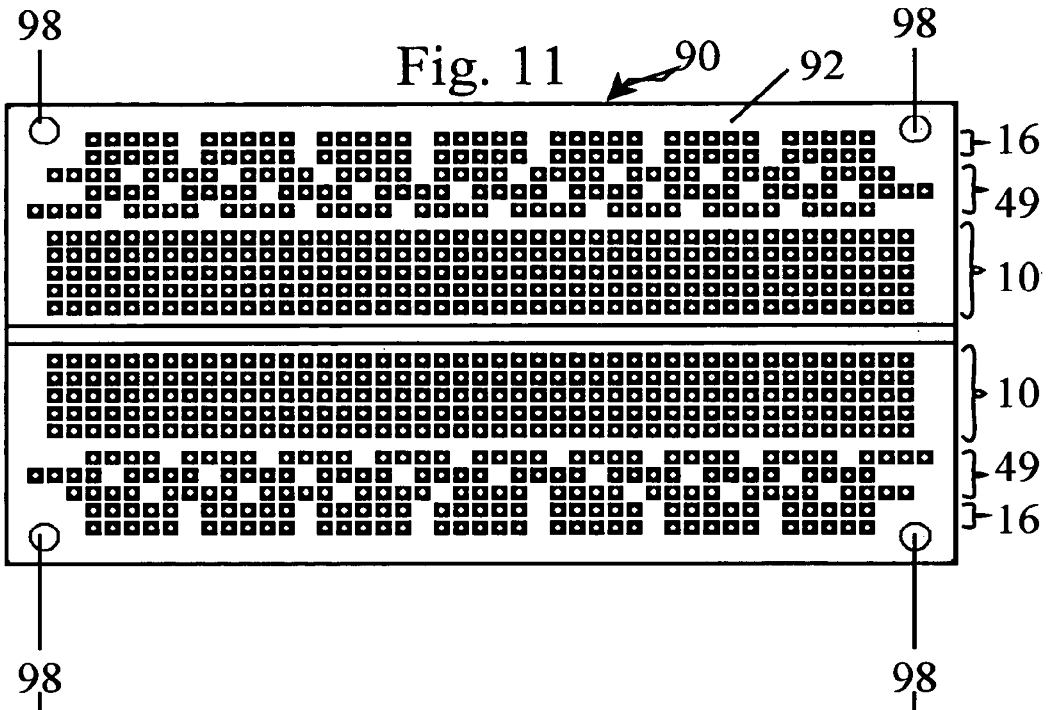
FIG. 11 is a top plan view of a solder-less breadboard, similar to the breadboard shown in FIG. 7, but with each row of pin holes in the connection strip including four (4) pin holes instead of the three (3) shown in FIG. 7 and is constructed according to the teachings of the present invention.

In FIG. 11 is illustrated a breadboard 90 which includes a one piece, continuous board or plate 92 of insulating material and, from top to bottom in the plate 92, a distribution strip section 16, a modified connection strip section 62, a terminal strip section 10, a modified connection strip section 62 and a distribution strip section 16 that is molded in one piece.

Figure 12:
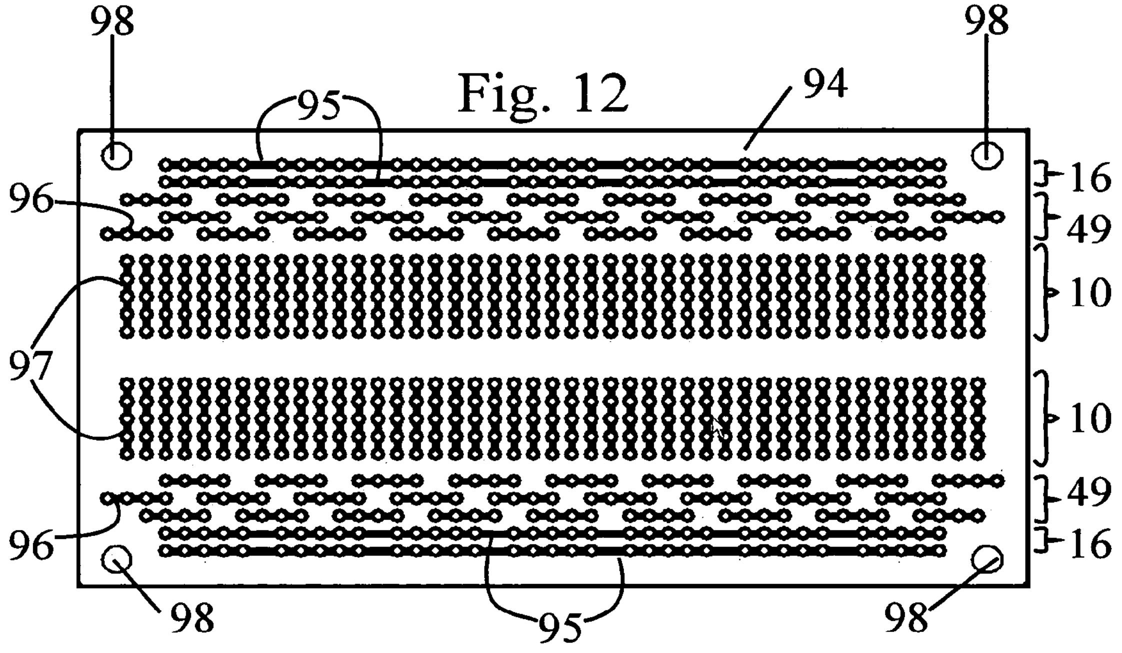
FIG. 12 is a plan view of the conductor strips on the bottom of a printed circuit board constructed from the breadboard shown in FIG. 11.

FIG. 12 shows a plan view of an underside 94 of the plate 92 which shows conductive strips 95 which are located beneath the distribution strip sections 16 in a printed circuit board made from the breadboard, conductive strips 96 beneath the modified connection strip sections 62 and conductive strips 97 beneath the terminal strip section 10 and four corner mounting holes 98 in the corners of each plate 92 and 94. It will be understood that the strips 95, 96 and 97 are illustrative of the arrays or gangs of connector clips in the plate 92.

Figure 13:
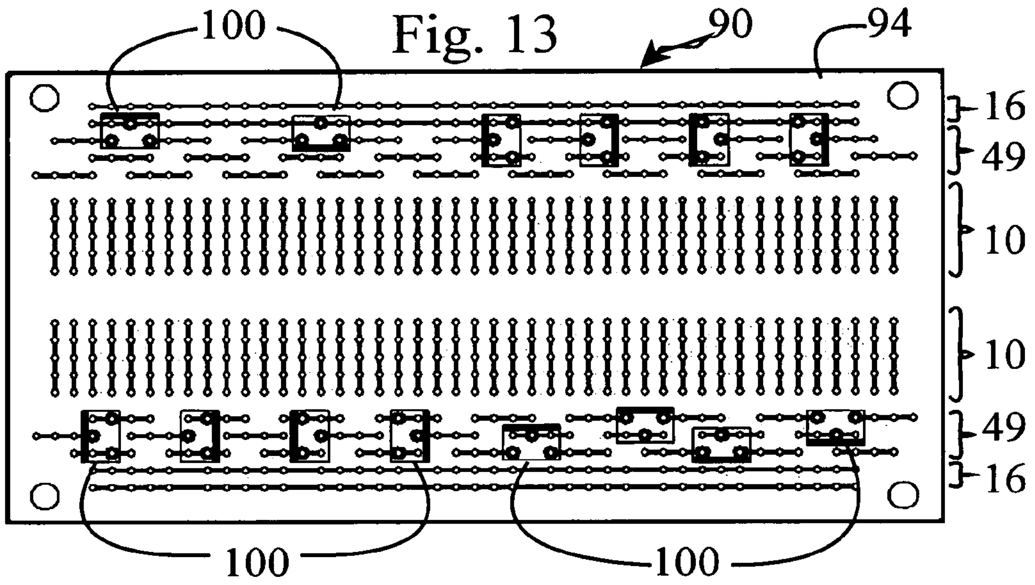
FIG. 13 is a plan view, similar to the view shown in FIG. 12, but also showing a number of transistors mounted on the breadboard shown in FIG. 11 and connected to the conductor strips of the connection strips.

A new method of interfacing electronic circuits is illustrated in FIG. 13. Here, fourteen transistors 100 are shown mounted on the top surface of the breadboard 90 and demonstrate that every possible pin of a three pin transistor or other electronic device 100 can be accommodated while controlling signal direction.

The six transistors 100 depicted on the upper side of the breadboard 90 demonstrate all six possible ways of orienting a transistor such that one pin is always connected directly to a power buss in the distribution strip, this configuration being used for power switching transistors, SCRs and TRIACs. It should be noted that the inter pin spacing on a standard solder-less breadboard will not accommodate direct connection to a power buss.

The eight transistors 100 depicted on the lower side of the breadboard 90 shown in FIG. 13 demonstrate eight possible ways of orienting a transistor such that all pins are isolated from the power buss, this configuration being used for amplifiers, oscillators, inverters, level changing, etc. It should be noted that a standard solder-less breadboard can only accommodate two possible orientations.

The structure shown in FIG. 13 further demonstrates that there are fourteen devices mounted on the board 90, with a total of forty two electrical connections, yet not one connection in the terminal strip section 10 has been used, thus this board can still hold it's full compliment of integrated circuits. It should be noted that on a standard solder-less breadboard of this size, if fourteen transistors were mounted with no spaces left between them for biasing components, the board could hold only one half of it's compliment of integrated circuits and, if one space were left between each transistor, the board could hold only one third of it's compliment of integrated circuits.

The breadboard 90 is sized to fit directly into a commercially available project box, such as an ABS plastic enclosure similar to Radio Shack part no. 270-1805.

Figure 14:
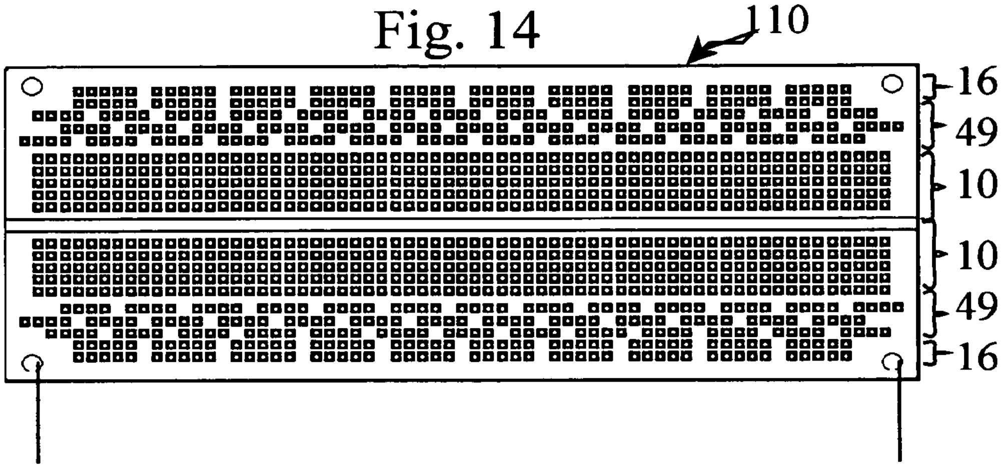
FIG. 14 is a top plan view a solder-less breadboard comprising a further arrangement of distribution strips, terminal strips and connection strips and is constructed according to the teachings of the present invention.

Another, one-piece-molded, breadboard 110 is illustrated in FIG. 14. This breadboard 110 is similar to but longer than the breadboard 90 shown in FIG. 11 and includes, from top to bottom, a distribution strip section 16, a modified connection strip section 62, a terminal strip section 10, a modified connection strip section 62 and a distribution strip section 16 and four corner mounting holes.

Figure 15:
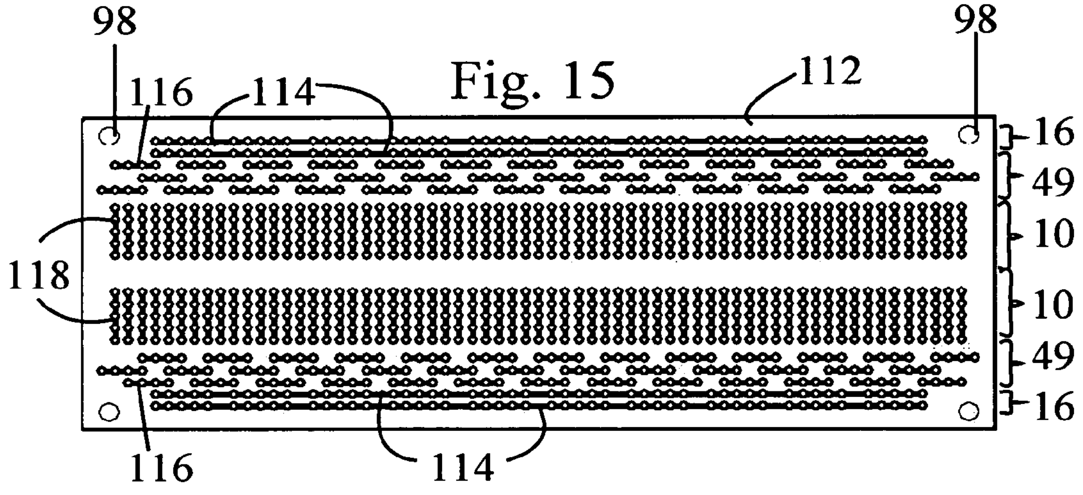
FIG. 15 is a plan view of the conductor strips on the bottom of a printed circuit board constructed from the breadboard shown in FIG. 14.

In FIG. 15 is shown an underside 12 of a printed circuit board made from the breadboard 110, with conductive strips 114, 116 and 118 and four corner mounting holes, identical to FIG. 14. Both of these plates 110 and 112 fit directly into an ABS plastic enclosure similar to Radio Shack part no. 270-1808.

Figure 16:
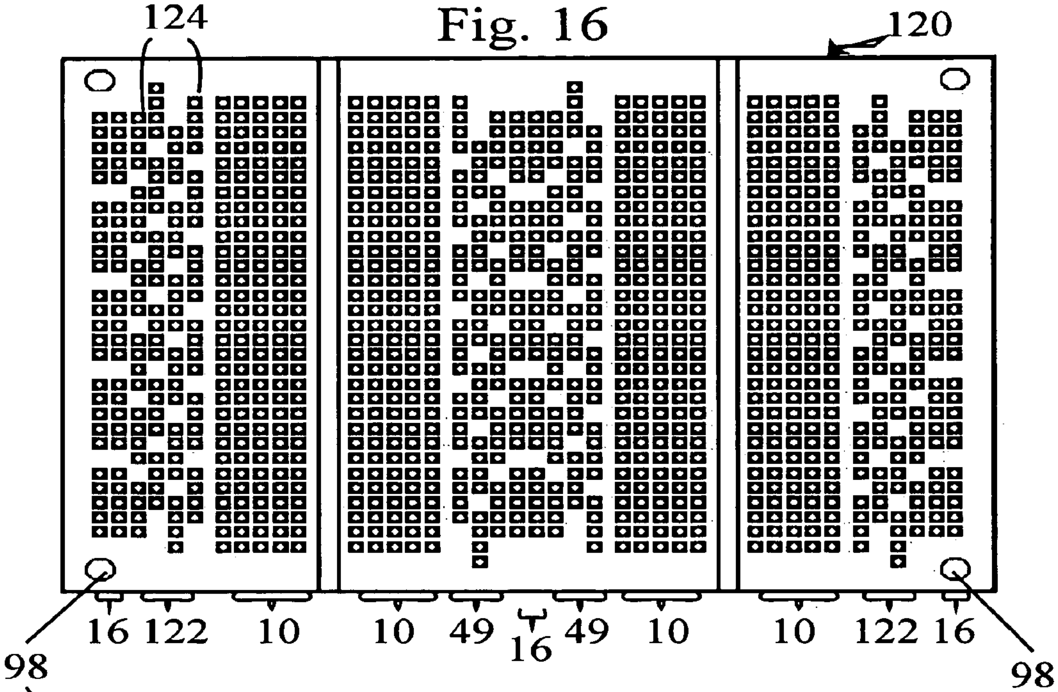
FIG. 16 is a top plan view of a solder-less breadboard comprising a still further arrangement of distribution strips, terminal strips and connection strips and is constructed according to the teachings of the present invention.
Figure 17:
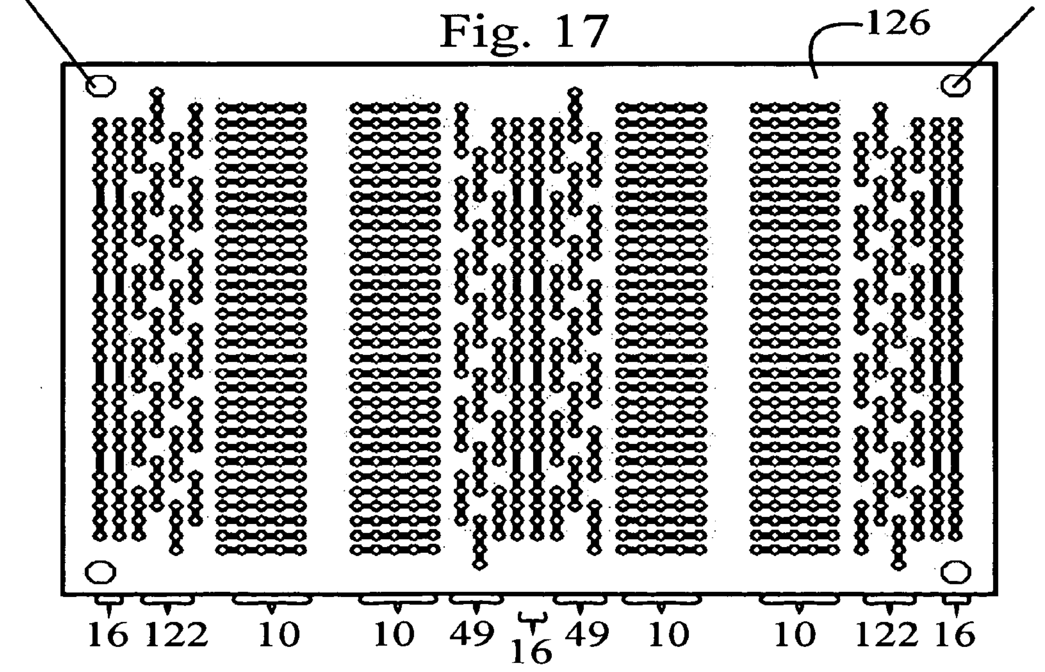
FIG. 17 is a plan view of the conductor strips on the bottom of a printed circuit board constructed from the breadboard shown in FIG. 16.

In FIG. 16 is illustrated a further, one-piece-molded breadboard 120 which includes from left to right, a distribution strip section 16, a third modified connection strip section 122 with four linear groupings 124, a double terminal strip section 10, a modified connection strip section 62, a distribution strip section 16, a modified connection strip section 62, a terminal strip section 10, a modified connection strip section 122 and a distribution strip section.16. An underside 126 with conductive strips of a printed circuit board which is constructed from the breadboard 120 is shown in FIG. 17. The breadboard 120 fits directly into an ABS plastic enclosure similar to Radio Shack part no. 270-1806.

Figure 18:
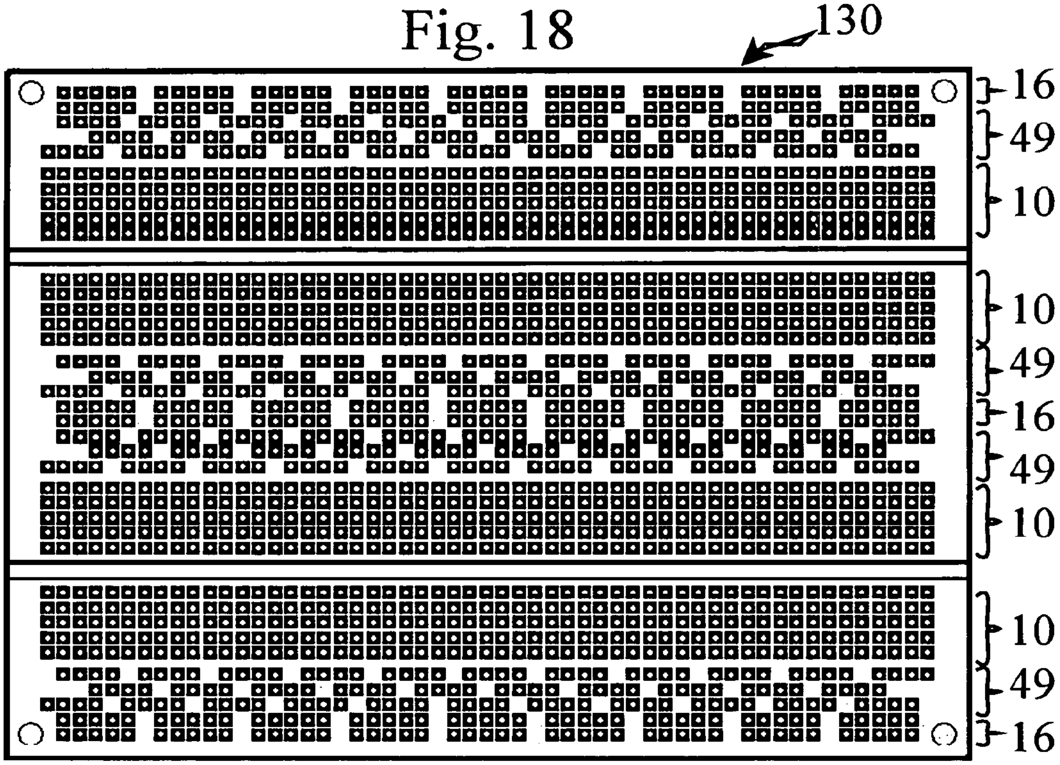
FIG. 18 is a top plan view of a solder-less breadboard comprising still another arrangement of distribution strips, terminal strips and connection strips and is constructed according to the teachings of the present invention.
Figure 19:
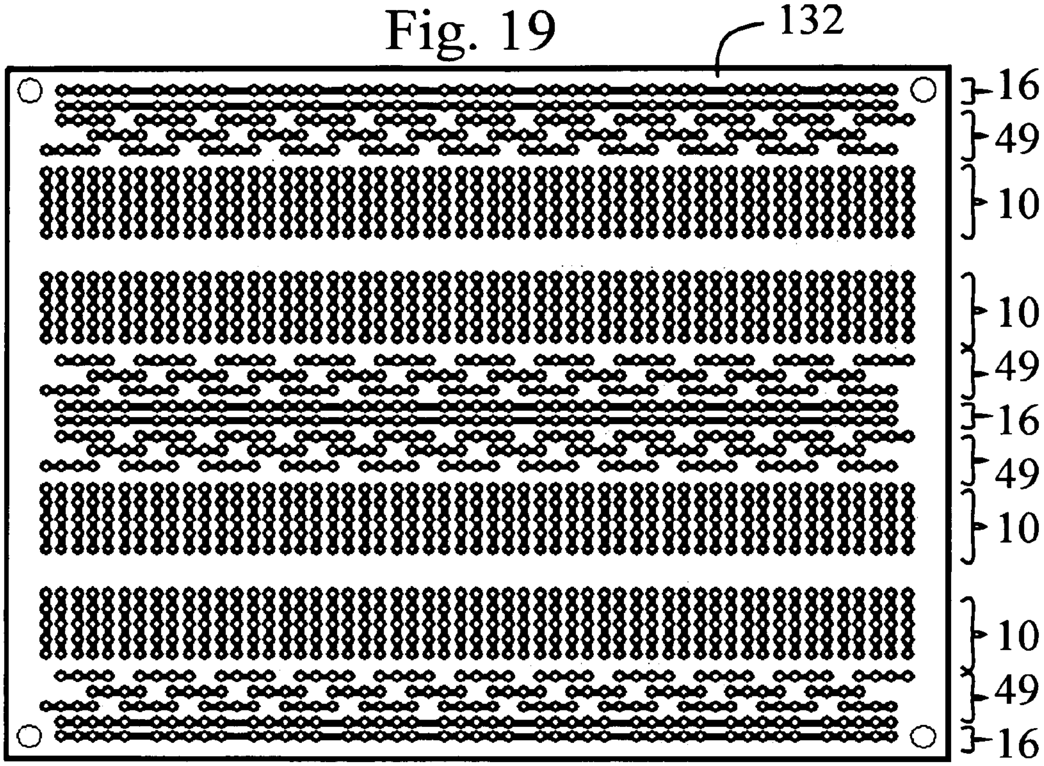
FIG. 19 is a plan view of the conductor strips on the bottom of a printed circuit board constructed from the breadboard shown in FIG. 18.

In FIG. 18 is illustrated a still further, one-piece-molded, breadboard 130 including, from left to right, a distribution strip section 16, a modified connection section 62, a terminal strip section 10, a modified connection strip section 62, a distribution strip section 16, a modified connection section 62, a terminal strip of strips of pinholes or contact points 14 section 10, a modified connection strip section 62 and a distribution section 16. An underside 132 with conductive strips or channels of a printed circuit board which is constructed from the breadboard 130 is shown in FIG. 19. The breadboard 130 fits directly into a commercially available project box, such as an ABS plastic enclosure similar to Radio Shack part no. 270-1807.

Figure 20:
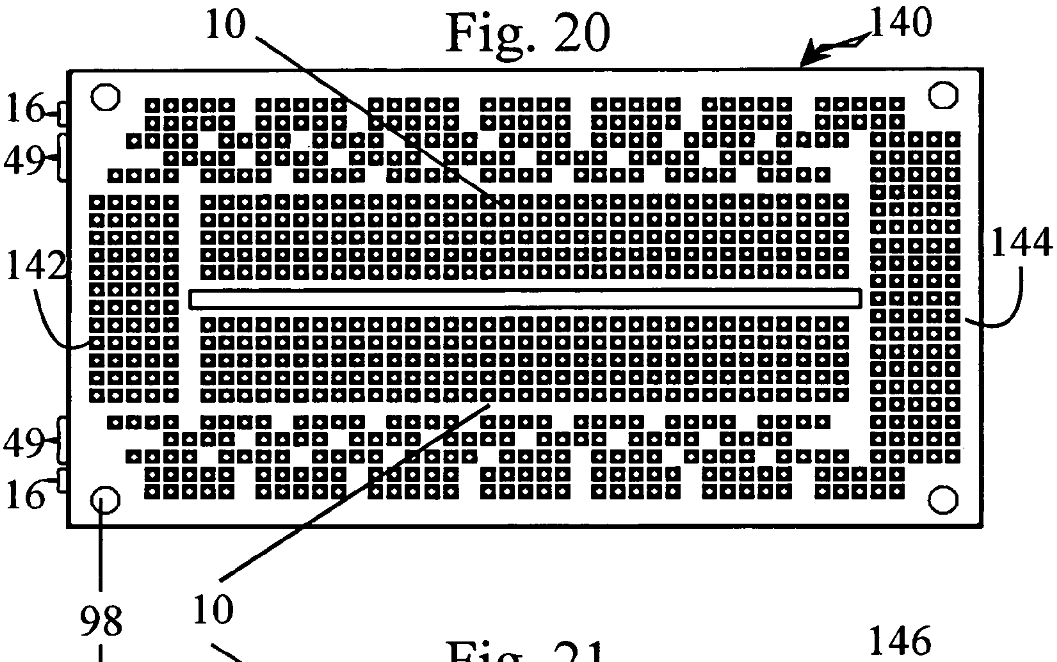
FIG. 20 is a top plan view of a solder-less breadboard comprising still another arrangement of distribution strips, terminal strips and connection strips and is constructed according to the teachings of the present invention.
Figure 21:
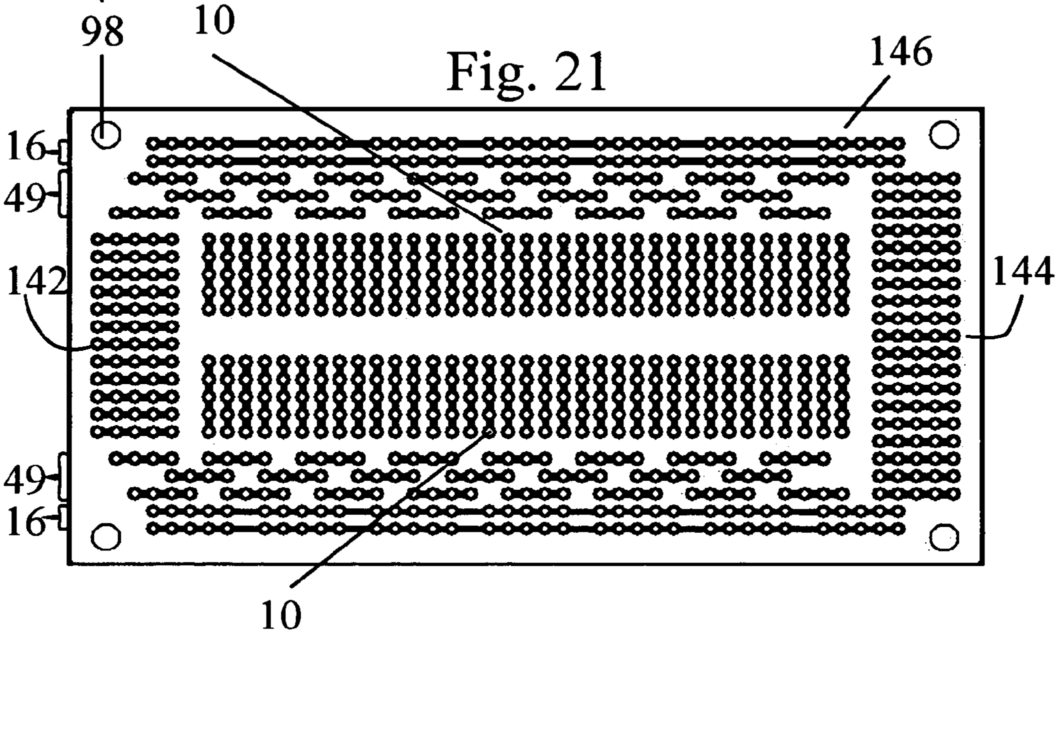
FIG. 21 is a plan view of the conductor strips on the bottom of a printed circuit board constructed from the breadboard shown in FIG. 10.

Still another, one-piece-molded, breadboard 140 is illustrated in FIG. 20 and includes, from top to bottom, a distribution section 16 a modified connection section 62, a shorter double terminal strip section 10, a modified connection strip section 62 and a distribution section 16 plus a short bank 142 of strips of pinholes or contact points 14 on the left side and a longer bank 144 of strips of pinholes or contact points 14 on the right side. This breadboard 140 is designed for use with embedded processors such as PIC devices. Notice that bank 142 at the far left is used for a programming/IO connector, the far right bank 144 is used for a general IO connector. FIG. 21 illustrates an underside 146 with conductive strips or channels of a printed circuit board which is constructed from the breadboard 140. The breadboard 140 fits directly into a commercially available project box, such as an ABS plastic enclosure similar to Radio Shack part no. 270-1805.

Figure 22:
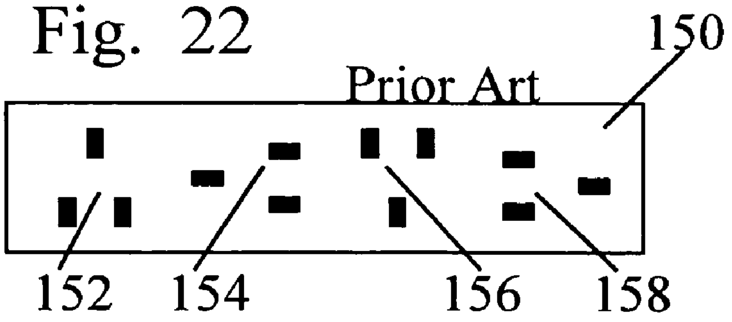
FIG. 22 is plan view of a prior art surface mount transistor placement orientation.

In FIG. 22 is illustrated a section of printed circuit board 150 containing four Prior Art SOT-23 surface mount transistor three connection location patterns 152, 154, 156 and 158. These four patterns are identical in nature, except that there is a 90 degree rotational difference in each successive orientation.

Figure 23:
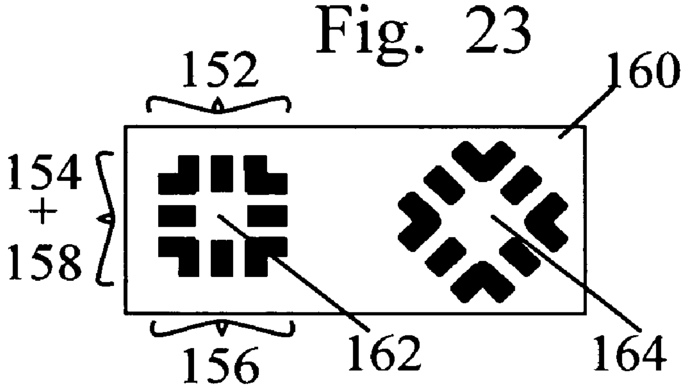
FIG. 23 is a plan view of a circuit board containing two new universal patterns for multiple orientations of surface mount transistors.

In FIG. 23 is illustrated a section of printed circuit board 160 containing patterns 152, 154, 156 and 158 superimposed on top of one another about a common center point, creating a new eight connection location pattern 162. This new pattern allows SOT-23 surface mount transistors to be mounted in any of the four orientations shown in patterns 152, 154, 156 and 158. By the act of superimposition, this pattern also allows SOT-23 devices in 4, 5 and 6 pins to be mounted in any of the said four orientations. Pattern 164 on plate 160 is identical in nature to pattern 162 except that there is a 45 degree rotational difference in orientation thus creating a diamond shaped eight connection location connector for surface mounted SOT-23 3, 4, 5 and 6 pin devices in four different orientations.

Figure 24:
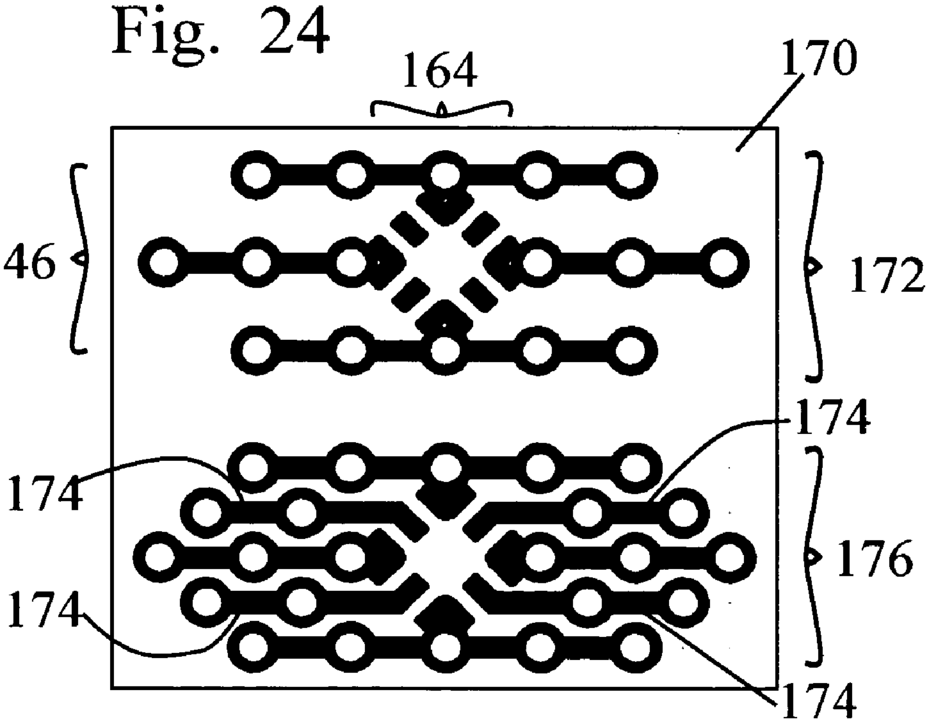
FIG. 24 is a plan view of a circuit board containing two new patterns including the orientations shown in FIG. 23 connected to through hole patterns.

In FIG. 24 is illustrated a section of printed circuit board 170 containing a new circuit pattern 172 that is created by placing pattern 164 in the center of a diamond shaped four pin socket 46 according to the teaching of the current invention. It should be noted that the four points or corners of the diamond shaped eight location pattern 172 are all in electrical conductivity with the four points or corners of socket 46 and there are four unused connection locations, one on each of the four sides of pattern 164 in pattern 172. It should further be noted that socket 46 in pattern 172 was created by the staggering of adjacent rows of connection strips. A new circuit pattern 176 on plate 170 is created by placing four new offset connection strips 174 between the three existing rows of connection strips and in electrical conductivity with the four previously unused connection locations in pattern 172. Thus pattern 176 allows four different mounting orientations of either through hole transistors or surface mount devices in SOT-23 3, 4, 5 and 6 pin packages on one integral pattern. It should finally be noted that pattern 176 is created by five rows of connection strips where each row is offset from each adjacent row and the center row is staggered from the two outer most rows. This pattern 176 uses both offsetting and staggering of rows according to the teachings of the present invention to gain maximum space utilization.

In FIG. 25 is illustrated a section of a circuit board 180 containing three Prior Art patterns for mounting integrated circuits, a 16 pin pattern 182 for through hole DIP packages, a 16 connection surface mount pattern 184 for SOP packages and a 28 connection surface mount pattern 186 for SOIC packages.

In FIG. 26 is illustrated a section of a circuit board 190 containing a new pattern 192 that is created by superimposing patterns 182, 184 and 186 on top of each other with left hand registration. Pattern 194 on plate 190 is created by completing the pattern 192 and placing all of the corresponding connection points in electrical conductivity with each other.

In FIG. 27 is illustrated a complete circuit board 200 containing a continuous pattern 194 in the central area between groupings of pattern 176.

In FIG. 28 is illustrated a section of a circuit board 210 that is taken from the center area of plate 200 and shows a close up view of pattern 194 included in a pattern of connection strips 220 and 240. The rows 220 and 240 are placed such that each row is offset from each adjacent row such that an array of spaces 260 is formed where each space in an interior row forms the center of a four pin diamond shaped socket 46 according to the teaching of the present invention.

It should be noted that circuit board plate 200 in FIG. 27 is extremely novel in that it is the first and only prototyping tool that can hold through hole DIP IC packages of 0.6" and 0.3" and surface mount SOP and SOIC IC packages as well as through hole transistors and surface mount SOT-23 3, 4, 5 and 6 pin packages in any combination on one integral pattern. It is an important teaching of the present invention that offsetting or staggering of adjacent rows of connection strips creates an asymmetrical electrical structure that more than doubles the electrical configurations possible in any integral circuit pattern it is used in.

Definitions:

DIP (Dual In-Line Pin) is a standard size package for through hole ICs in 0.6" and 0.3" frame with 0.1" lead pitch.

SOT-23 is a standard package for surface mount devices in very small size, for transistors, etc.

SOP is a standard size package for surface mount ICs in thin frame with 0.05" lead pitch.

SOIC is a standard size package for surface mount ICs in wide frame with 0.05" lead frame From the foregoing description, it will be apparent that the circuit board of the present invention has a number of advantages some of which have been described above and others of which are inherent in the invention.

Accordingly the scope of the invention is only to be limited as necessitated by the accompanying claims.

I claim:

1. A printed circuit board comprising a plate made of an insulating material and having opposite surfaces and having a connection strip portion including a grouping of at least three rows of sets of at least three spaced apart connection locations in each set on at least one of said plate surfaces, the centers of the connection locations in each set being spaced from each other by a predetermined distance, groups of conductive strips on one of said plate surfaces, each conductive strips being aligned with and in electrical conductivity with one of the rows of three spaced apart connection locations each connection location defining an electrical contact point on the strip with all of the conductive strips being electrically isolated from each other, and the sets being aligned in each row end-to-end and each row being offset or staggered from each adjacent row , such that an array of spaces is formed, with each space in an interior row forming a center of a diamond shaped four connection point connector, that has a connection location on a conductive strip at each of its four points or corners, that originates from a different conductive strip.

2. The printed circuit board of claim 1 wherein said electrical contact points comprise a metal foil area on at least one of said surfaces with a hole through it's center that extends through said plate and both of said surfaces such that a wire or lead from an electrical component can pass through said hole from the opposite surface of said plate and a soldered connection can be made between said metal foil area and said wire or lead, this technique being commonly referred to as through hole mounting.

3. The printed circuit board of claim 1 wherein said electrical contact points comprise a solid metal foil area on at least one of said surfaces such that a soldered connection can be made between metal foil said area and a wire or lead from an electrical component that is placed on the same surface as said area, this technique being commonly referred to as surface mounting.

4. The printed circuit board of claim 1 wherein some of said electrical contact points comprise a metal foil area on at least one of said surfaces with a hole through it's center that extends through said plate and both of said surfaces such that a wire or lead from an electrical component can pass through said hole from the opposite surface of said plate and a soldered connection can be made between said metal foil area and said wire or lead, this technique being commonly referred to as through hole mounting and some of said electrical contact points comprise a solid metal foil area on at least one of said surfaces such that a soldered connection can be made between said metal foil said area and a wire or lead from an electrical component that is placed on the same surface as said area, this technique being commonly referred to as surface mounting such that said circuit board can support both said through hole mounting and said surface mounting of wires or leads from electrical components.

5. The printed circuit board of claim 1 wherein said space is approximately 0.1 inch.

6. The printed circuit board of claim 5 wherein the distance of said offset of adjacent rows is a fractional distance no greater than approximately 0.1 inch.

7. The printed circuit board of claim 5 wherein the distance of said staggering of adjacent rows is a pre-selected distance that is no less than approximately 0.1 inch.

8. The printed circuit board of claim 1 combined with a terminal strip portion in said plate comprising at least one elongate grouping of transversely extending rows of connection locations, with each row containing three to seven connection locations, a conductive strip on one of said plate surfaces being aligned with and in electrical conductivity with each row, each connection location defining an electrical contact point on the conductive strip, with all of the conductive strips being electrically isolated from each other, and the adjacent connection locations having a predetermined center-to-center spacing between them.

9. The printed circuit board of claim 8 comprising two elongate groupings of transversely extending rows of holes.

10. The printed circuit board of claim 9 wherein the two groupings are spaced apart a distance which will result in an end hole in one row of holes in one grouping of rows of holes having a center-to-center distance of approximately 0.3 inch with the closest end hole in a row of holes in the other grouping of rows of holes.

11. The printed circuit board of claim 8 wherein the center-to-center spacing between adjacent connection locations is approximately 0.1 inch.

12. The printed circuit board of claim 8 wherein the center-to-center spacing between adjacent rows is approximately 0.05 inch.

13. The printed circuit board of claim 1 combined with a distribution strip portion comprising at least one line of spaced apart connection locations on at least one surface of the plate, with adjacent connection locations being separated by a predetermined center-to-center spacing and a conductive strip on said plate surface, being aligned with and in electrical conductivity with one of the rows of spaced apart connection locations.

14. The printed circuit board of claim 1 wherein five rows of sets of connection strips are provided with each row being offset from each adjacent row and the center row being staggered from the two outside rows and a diamond shaped eight connection point connector being formed in the center of the four connection point connector formed by the staggering of every other row such that the eight connection point connector has a connection location on a conductive strip at each of it's eight connection points that originates from a different conductive strip.

15. The printed circuit board of claim 9 wherein each connection strip in the terminal strip portion include said electrical contact points and wherein some of said electrical contact points comprise a metal foil area on at least one of said surfaces with a hole through it's center that extends through said plate and both of said surfaces such that a wire or lead from an electrical component can pass through said hole from the opposite surface of said plate and a soldered connection can be made between said metal surface area and said wire or lead, this technique being commonly referred to as through hole mounting and some of said electrical contact points comprise a solid metal foil area on at least one of said surfaces such that a soldered connection can be made between said metal foil area and a wire or lead from an electrical component that is placed on the same surface as said area, this technique being commonly referred to as surface mounting such that said circuit board can support both said through hole mounting and said surface mounting of wires or leads from electrical components.

16. The printed circuit board of claim 9 wherein each connection strip in the terminal strip portion is offset or staggered from each adjacent connection strip such that an array of spaces is formed, with each space in an interior row forming a center of a diamond shaped four connection point connector, that has a connection location on a conductive strip at each of its four points or corners, that originates from a different conductive strip.

17. A printed circuit board comprising a plate made of an insulating material and having opposite surfaces and having a connection strip portion including a grouping of at least three rows of sets of at least three spaced apart connection locations in each set on at least one of said plate surfaces, the centers of the connection locations in each set being spaced from each other by a predetermined distance, groups of conductive strips on one of said plate surfaces, each conductive strips being aligned with and in electrical conductivity with one of the rows of three spaced apart connection locations each connection location defining an electrical contact point on the strip with all of the conductive strips being electrically isolated from each other, and the sets being aligned in each row end-to-end and each row being offset or staggered from each adjacent row, such that an array of spaces is formed, with each space in an interior row forming a center of a diamond shaped four connection point connector, that has a connection location on a conductive strip at each of its four points or corners, that originates from a different conductive strip, a terminal strip portion in said plate comprising at least one elongate grouping of transversely extending rows of connection locations, with each row containing three to seven connection locations, a conductive strip on one of said plate surfaces being aligned with and in electrical conductivity with each row, each connection location defining an electrical contact point on the conductive strip, with all of the conductive strips being electrically isolated from each other, and the adjacent connection locations having a predetermined center-to-center spacing between them and a distribution strip portion comprising at least one line of spaced apart connection locations on at least one surface of the plate, with adjacent connection locations being separated by a predetermined center-to-center spacing and a conductive strip on said plate surface, being aligned with and in electrical conductivity with one of the rows of spaced apart connection locations.

18. The printed circuit board of claim 17 wherein the terminal strip portion comprises two elongate groupings of transversely extending rows of holes.

19. The printed circuit board of claim 18 wherein the two groupings are spaced apart a distance which will result in an end hole in one row of holes in one grouping of rows of holes having a center-to-center distance of approximately 0.3 inch with the closest end hole in a row of holes in the other grouping of rows of holes.

20. The printed circuit board of claim 17 wherein said connection strip portion, said terminal strip portion and said distribution strip portion are all formed in a one piece, integral plate.

21. The printed circuit board of claim 17 wherein said connection strip portion, said terminal strip portion and said distribution strip portion are formed in separate plates and then assembled together to form the printed circuit board.

22. The printed circuit board of claim 17 being sized to fit directly into a commercially available project box.

23. The printed circuit board of claim 17 wherein the connection strip portion comprises five rows of sets of connection strips with each row being offset from each adjacent row and the center row being staggered from the two outside rows and a diamond shaped eight connection point connector being formed in the center of the four connection point connector formed by the staggering of every other row such that the eight connection point connector has a connection location on a conductive strip at each of it's eight connection points that originates from a different conductive strip and the terminal strip portion comprises a plurality of connection strips that are offset or staggered from each adjacent connection strip such that an array of spaces is formed, with each space in an interior row forming a center of a diamond shaped four connection point connector, that has a connection location on a conductive strip at each of its four points or corners, that originates from a different conductive strip.

* * * * *